US012660347B2

(12) United States Patent
Kwak et al.

(10) Patent No.: US 12,660,347 B2
(45) Date of Patent: Jun. 16, 2026

(54) IMAGE SENSOR AND METHOD OF MANUFACTURING THE IMAGE SENSOR

(71) Applicant: Samsung Electronics Co., Ltd., Suwon-si (KR)

(72) Inventors: Byeong Eun Kwak, Suwon-si (KR); Yeon Woo Kim, Suwon-si (KR); Sook Young Roh, Suwon-si (KR); Junwon Han, Suwon-si (KR); Seok Ho Yun, Suwon-si (KR); Ki-Ryong Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 362 days.

(21) Appl. No.: 18/311,401

(22) Filed: May 3, 2023

(65) Prior Publication Data

US 2024/0006435 A1      Jan. 4, 2024

(30) Foreign Application Priority Data

Jun. 29, 2022      (KR) ........................ 10-2022-0079400

(51) Int. Cl.
*H10F 39/00*      (2025.01)
*H10F 39/18*      (2025.01)
*G02B 1/11*      (2015.01)

(52) U.S. Cl.
CPC ......... *H10F 39/805* (2025.01); *H10F 39/024* (2025.01); *H10F 39/182* (2025.01); *H10F 39/8053* (2025.01); *H10F 39/807* (2025.01); *G02B 1/11* (2013.01)

(58) Field of Classification Search
CPC .... H10F 39/805; H10F 39/807; H10F 39/182; H10F 39/8053; H10F 39/024; G02B 1/11

USPC .......................................................... 257/437
See application file for complete search history.

(56) References Cited

U.S. PATENT DOCUMENTS

| | | | |
|---|---|---|---|
| 8,003,425 B2 | 8/2011 | Adkisson et al. | |
| 8,173,949 B2 | 5/2012 | Choi et al. | |
| 9,170,350 B2 | 10/2015 | Jeong et al. | |
| 10,249,661 B2 | 4/2019 | Lin | |
| 10,277,788 B2 | 4/2019 | Jeong et al. | |

(Continued)

FOREIGN PATENT DOCUMENTS

| | | |
|---|---|---|
| KR | 10-2010-0109405 A | 10/2010 |
| KR | 20170006216 A | 1/2017 |

(Continued)

OTHER PUBLICATIONS

I. Oshiyama et al., "Visible Light Sensitivity Enhancement of COMS Image Sensor with Pseudo High Refractive Index Film Integrated by Directed Self-Assembly Process," 2021 5th IEEE Electron Devices Technology & Manufacturing Conference (EDTM).

(Continued)

*Primary Examiner* — Igwe U Anya
(74) *Attorney, Agent, or Firm* — Harness, Dickey & Pierce, P.L.C.

(57) ABSTRACT

An image sensor with improved performance is provided. The image sensor includes a substrate, a prism structure on the substrate, the prism structure including at least one nanopattern, and an anti-reflection structure on the prism structure, the anti-reflection structure including at least one opening array, the opening array including a plurality of spaced-apart openings.

20 Claims, 23 Drawing Sheets

(56)          References Cited

U.S. PATENT DOCUMENTS

| 10,325,950 B2 | 6/2019 | Sato | |
| 2007/0200056 A1 | 8/2007 | Kim et al. | |
| 2009/0053465 A1* | 2/2009 | Scherg | G02C 11/08 |
| | | | 428/137 |
| 2010/0178018 A1* | 7/2010 | Augusto | H10F 39/811 |
| | | | 385/131 |
| 2010/0244169 A1* | 9/2010 | Maeda | H10F 77/703 |
| | | | 257/E31.127 |

FOREIGN PATENT DOCUMENTS

| KR | 20200042554 A | 4/2020 |
| KR | 20200084604 A | 7/2020 |

OTHER PUBLICATIONS

Korean Office Action dated Dec. 10, 2025 for corresponding Korean Application No. 10-2022-0079400.

* cited by examiner

110 wavelength (nm)

—————— (a)
—·——·—— (d)

IMAGE SENSOR AND METHOD OF MANUFACTURING THE IMAGE SENSOR

CROSS-REFERENCE TO RELATED APPLICATION

This application claims the benefit of priority under 35 U.S.C. § 119 from Korean Patent Application No. 10-2022-0079400, filed on Jun. 29, 2022 in the Korean Intellectual Property Office, the contents of which in its entirety are herein incorporated by reference.

BACKGROUND

1. Technical Field

Various example embodiments of the inventive concepts relate to an image sensor, a system including the image sensor, and/or a method of manufacturing the image sensor.

2. Description of the Related Art

An image sensing semiconductor device converts optical information into an electrical signal. Such an image sensing device may include a Charge Coupled Device (CCD) image sensing device and a Complementary Metal-Oxide Semiconductor (CMOS) image sensing device.

The CMOS image sensor may be abbreviated as CIS (CMOS image sensor). The image sensor may include a pixel array including a plurality of photodiodes for sensing light, a plurality of transistors for processing charges generated by the photodiode, and the like.

Recently, to improve the light use efficiency of an image sensor, an attempt has been made to use a nano-sized color separation device instead of a microlens or color filter.

SUMMARY

Various example embodiments of the inventive concepts concern a miniaturized image sensor, a system including the miniaturized image sensor, and/or providing an image sensor with improved performance.

Various example embodiments of the inventive concepts concern a miniaturized image sensor, a system including the miniaturized image sensor, and/or providing a method of manufacturing an image sensor with improved performance.

However, aspects of the example embodiments of the inventive concepts are not restricted to those set forth herein. The above and other aspects of the example embodiments will become more apparent to one of ordinary skill in the art to which the inventive concepts pertain by referencing the detailed description of the example embodiments given below.

According to at least one example embodiment, there is provided an image sensor including a substrate, a prism structure on the substrate, the prism structure including at least one nanopattern, and an anti-reflection structure on the prism structure, the anti-reflection structure including at least one opening array, the opening array including a plurality of spaced-apart openings.

According to at least one example embodiment, there is provided an image sensor including a substrate having an upper surface extending in a first direction and a second direction, the first direction and the second direction perpendicular to each other, the substrate including a plurality of pixel isolation patterns extending in a third direction, a plurality of pixel regions defined by the plurality of pixel isolation patterns, a prism structure on the plurality of pixel regions, the prism structure including at least one nanopattern, and an anti-reflection structure on the prism structure, the anti-reflection structure including an opening array, the opening array including a plurality of spaced-apart openings.

According to at least one example embodiment, there is provided a method of manufacturing an image sensor, including forming a prism structure on a substrate, forming an anti-reflection structure on the prism structure, forming a neutral layer on the anti-reflection structure, forming a block copolymer layer on the neutral layer, annealing the block copolymer layer to form a first pattern and a second pattern, selectively removing the first pattern out of the first pattern and the second pattern, and forming a plurality of spaced-apart anti-reflection structure patterns by using the second pattern as a mask.

BRIEF DESCRIPTION OF THE DRAWINGS

The above and other aspects and features of the example embodiments will become more apparent by describing in detail various example embodiments thereof with reference to the attached drawings, in which:

Figure 12:
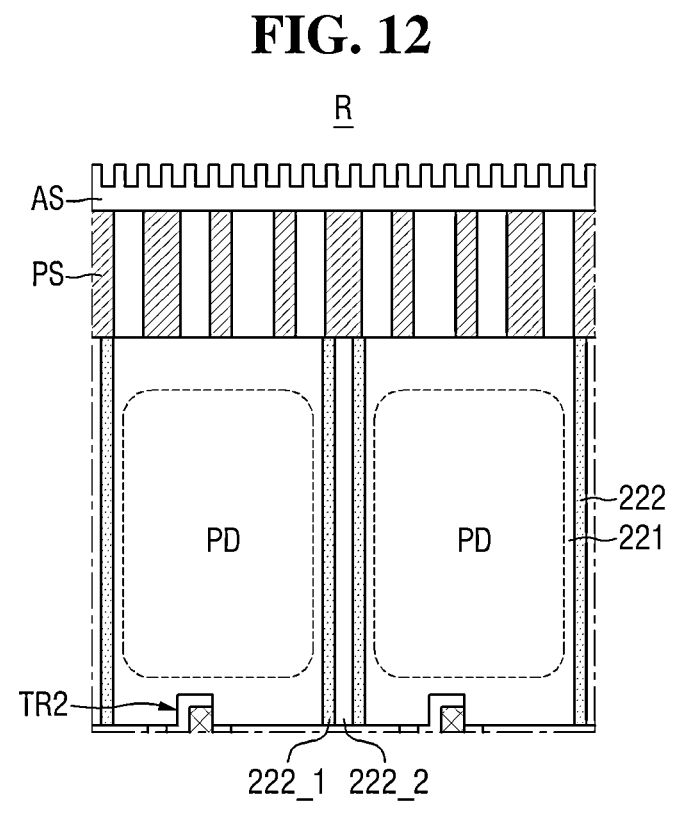

FIG. 12 is a diagram of an image sensor according to some example embodiments, similar to FIG. 10.

FIGS. 14 to 19 illustrate intermediate steps of a method of manufacturing an image sensor according to some example embodiments.

FIGS. 20 and 21 illustrate intermediate steps of a method of manufacturing an image sensor according to some example embodiments.

DETAILED DESCRIPTION

Hereinafter, various example embodiments of the inventive concepts will be described with reference to the attached drawings. An image sensor according to some example embodiments will be described with reference to FIGS. 1 to 13.

Figure 1:
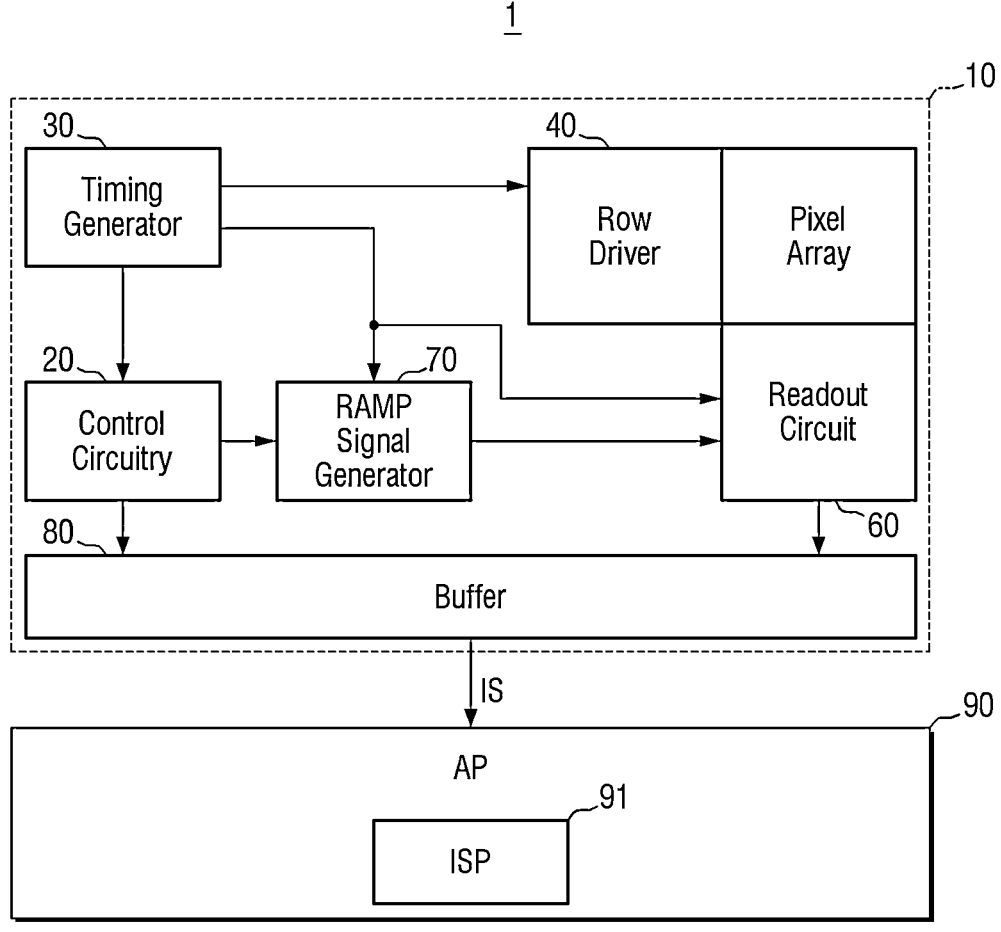
FIG. 1 is a block diagram illustrating an image sensing system according to some example embodiments.

FIG. 1 is a block diagram illustrating an image sensing system 1 according to some example embodiments.

Referring to FIG. 1, the image sensing system 1 may include an image sensor 10 and/or at least one application processor 90, etc., but the example embodiments are not limited thereto, and for example, the image sensing system 1 may include a greater or lesser number of constituent components. Here, the image sensor 10 may be arranged in a camera module, but the example embodiments are not limited thereto.

The image sensor 10 may generate at least one image signal IS by sensing an image of a sensing target by using incident light reflecting off of the sensing target, etc. In some example embodiments, the image signal IS generated may be, for example, a digital signal, but the example embodiments are not limited thereto, and for example, may be an analog signal.

The image signal IS may be provided to and processed by the application processor 90. More specifically, the image signal IS may be provided to and processed by an image signal processor 91 included in the application processor 90. The image signal processor 91 may develop and/or process the image signal IS to be easily displayed on a display device.

In some example embodiments, the image sensor 10 and the application processor 90 may be arranged separately as shown. For example, the image sensor 10 may be mounted on a first semiconductor chip and the application processor 90 may be mounted on a second semiconductor chip to intercommunicate through an interface. However, the example embodiments according to the inventive concepts are not limited thereto, and the image sensor 10 and the application processor 90 may be implemented in one semiconductor package, for example, a multi-chip package (MCP), etc. The image sensor 10 and/or the application processor 90, in whole or in part, may be implemented as processing circuitry, and may include hardware including logic circuits; a hardware/software combination such as a processor executing software and/or firmware; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc., but is not limited thereto.

The image sensor 10 may include a control register circuitry 20, a timing generator 30, a row driver 40, an active pixel sensor array APS, a readout circuit 60, a ramp signal generator 70, and/or a buffer unit 80, etc., but is not limited thereto, and for example, may include a greater or lesser number of constituent components.

The control register circuitry 20 (e.g., controller, control circuitry, control register block, etc.) may generally control the operation of the image sensor 10. In particular, the control register circuitry 20 may directly transmit at least one operation signal to the timing generator 30, the ramp signal generator 70, and/or the buffer unit 80, etc., but is not limited thereto The timing generator 30 may generate at least one signal (e.g., a clock signal, etc.) that is a reference for the operation timing of various components of the image sensor 10. The operation timing reference signal generated by the timing generator 30 may be transmitted to the row driver 40, the readout circuit 60, the ramp signal generator 70, and/or others.

The ramp signal generator 70 may generate a ramp signal used in the readout circuit 60 and transmit the ramp signal generated to the readout circuit 60, etc. For example, the readout circuit 60 may include a correlated double sampler (CDS), a comparator, etc., where the ramp signal generator 70 may generate a ramp signal used for the CDS, the comparator, and/or the like, and transmit the ramp signal generated to the CDS, the comparator, and/or the like.

The buffer unit 80 may include, for example, at least one latch unit (e.g., latch), but is not limited thereto. The buffer unit 170 may temporarily store the image signal IS to be transmitted externally, and may transmit the image signal IS to external memory and/or an external device, etc.

The active pixel sensor array APS may receive light (e.g., incident light, etc.) to sense at least one external image. The active pixel sensor array APS may include a plurality of pixels (e.g., unit pixels). The row driver 40 may selectively activate at least one row in the active pixel sensor array APS.

The readout circuit 60 may sample the pixel signal provided from the active pixel sensor array APS, compare the sampled pixel signal with the ramp signal, and convert, based on the results of the comparison, the analog image signal (data) to a digital image signal (data), etc., but is not limited thereto.

Figure 2:
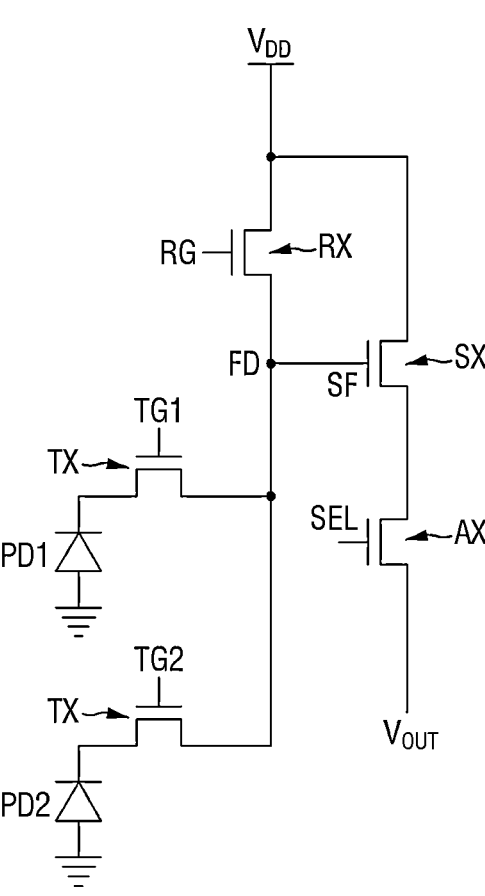
FIG. 2 is a circuit diagram illustrating a unit pixel region of an active pixel sensor array of FIG. 1, according to at least one example embodiment.

FIG. 2 is a circuit diagram illustrating a unit pixel region of the active pixel sensor array APS of FIG. 1 according to at least one example embodiment. As a side note, FIG. 2 may be a 4T structure of the unit pixel region constituting the active pixel sensor array APS, but the example embodiments are not limited thereto.

Referring to FIG. 2, the active pixel sensor array APS may include photoelectric conversion devices PD1, PD2, a plurality of transfer transistors TX, a floating diffusion region FD, a reset transistor RX, a source follower transistor SX, and/or a selection transistor AX, etc., but is not limited thereto.

The photoelectric conversion devices PD1, PD2 may generate electric charges in proportion to the amount of light incident received from an outside source and/or external source. The photoelectric conversion devices PD1, PD2 may be photodiodes each including an n-type impurity region and a p-type impurity region. The photoelectric conversion devices PD1, PD2 may be coupled to the transfer transistors TX that transfer the generated and accumulated charges to the floating diffusion region FD. The floating diffusion region FD is a region which converts electric charges into voltages, and since it has parasitic capacitance, it can cumulatively store electric charges.

The transfer transistors TX may each have one end (e.g., a first end) connected to one of the photoelectric conversion devices PD1, PD2, and the other end (e.g., a second end) connected to the floating diffusion region FD. The transfer transistors TX may each be formed of a transistor driven by a desired and/or predetermined bias, for example, transfer signals. The transfer signals may be applied through the transfer gates TG1, TG2, etc. For example, the transfer transistors TX may transfer the generated charges from the photoelectric conversion devices PD1, PD2 to the floating diffusion region FD according to and/or based on the transfer signals.

The source follower transistor SX may amplify a change in the electrical potential (e.g., voltage) of the floating diffusion region FD that has received the charge transferred from the photoelectric conversion devices PD1, PD2, and may output the amplified electrical potential change to an output line $V_{OUT}$. When the source follower transistor SX is turned on, a desired and/or predetermined electrical potential, which is provided to the drain of the source follower transistor SX, for example, a power supply voltage $V_{DD}$, may be transferred to the drain region of the selection transistor AX. The source follower gate SF of the source follower transistor SX may be connected with the floating diffusion region FD, but is not limited thereto.

The selection transistor AX may select at least one unit pixel region to be read in units of rows. The selection transistor AX may include at least one transistor driven by at least one selection line for applying a desired and/or predetermined bias, e.g., a row selection signal. The row selection signal may be applied through the selection gate SEL.

The reset transistor RX may reset and/or periodically reset the floating diffusion region FD. The reset transistor RX may include a transistor driven by a reset line that applies a desired and/or predetermined bias, for example, a reset signal. The reset signal may be applied through the reset gate RG to the reset transistor RX. When the reset transistor RX is turned on by the reset signal, a desired and/or predetermined electrical potential provided to the drain of the reset transistor RX, for example, the power voltage $V_{DD}$, may be transferred to the floating diffusion region FD.

Although FIG. 2 illustrates the plurality of photoelectric conversion devices PD1, PD2 as being configured to electrically share one floating diffusion region FD, the example embodiments of the inventive concepts are not limited thereto. For example, one unit pixel region may include either one of the photoelectric conversion devices PD1 and PD2, a floating diffusion region FD, and four transistors TX, RX, AX, and SX in another configuration wherein the reset transistor RX, the source follower transistor SX, and/or the selection transistor AX may be shared by neighboring unit pixel regions, but the example embodiments are not limited thereto. Additionally, the example embodiments are not limited in number to the two photoelectric conversion devices PD1 and PD2 that electrically share one floating diffusion region FD, but may include a greater or lesser number of photoelectric conversion devise, floating diffusion regions, and/or transistors, etc. This can improve the degree of integration of the image sensor according to some example embodiments.

Different from what is shown by the drawings, as the area of the unit pixel region becomes smaller, the photoelectric conversion devices PD and the transfer transistors TX may be formed on one semiconductor chip, while the reset transistor RX, the source follower transistor SX, and the selection transistor AX may be formed in another semiconductor chip. The semiconductor chips may be aligned to form a unit pixel region, but is not limited thereto.

Figure 3:
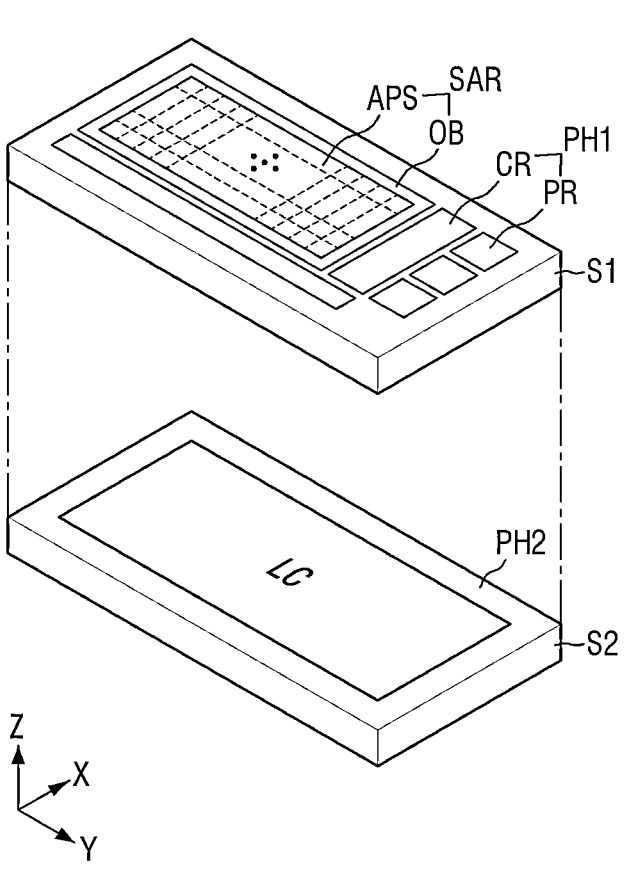
FIG. 3 is a diagram illustrating a conceptual layout of an image sensor of FIG. 1, according to at least one example embodiment.

FIG. 3 is a diagram illustrating a conceptual layout of the image sensor 10 of FIG. 1 according to at least one example embodiment.

Referring to FIG. 3, an image sensor 10 may include a first region S1 and/or a second region S2 stacked in a first direction (Z, for example, a vertical direction), but is not limited thereto, and for example, may include a greater or lesser number of regions and/or may have regions in a different direction. The first region S1 and the second region S2 may intersect the first direction Z and extend in the second direction X and the third direction Y parallel to the upper surface of a substrate 110 described below, but are not limited thereto. The components (e.g., blocks) shown in FIG. 1 may be arranged in the first region S1 and/or the second region S2, etc.

Although not shown in the drawings, under the second region S2, at least one third region may be arranged with a memory therein. In this case, the memory in the third region may receive image data from the first region S1 and/or the second region S2, store and/or process the image data, and retransmit the resultant image data to the first region S1 and/or the second region S2, but the example embodiments are not limited thereto. In this case, the memory may include a memory device such as a dynamic random access memory (DRAM) device, a static random access memory (SRAM) device, a spin transfer torque magnetic random access memory (STT-MRAM) device, and/or a flash memory device, etc. When the memory includes, for example, a DRAM device, it may receive and/or process image data at a relatively high speed. Additionally, in some example embodiments, the memory may be arranged in the second region S2, etc.

The first region S1 may include a sensor array region SAR and/or a first peripheral area PH1, etc., and the second region S2 may include a logic circuit region LC and/or a second peripheral area PH2, etc., but the example embodiments are not limited thereto. The first region S1 and the second region S2 may be sequentially stacked up and down (e.g., vertically), but are not limited thereto.

In the first region S1, the sensor array region SAR may include an area corresponding to the active pixel sensor array APS of FIG. 1, but is not limited thereto. For example, the sensor array region SAR may be internally formed with a plurality of unit pixels arranged two-dimensionally (e.g., in a matrix form), but is not limited thereto.

The sensor array region SAR may include the light-receiving area represented by APS (active pixel sensor array) and/or an opaque or light-blocking area OB, etc. The light-receiving area APS may be provided with active pixel sensor arrays arranged to receive light and generate an active signal. The light-blocking area OB may be provided with optical black pixels arranged to generate an optical black signal. The light-blocking area OB may be formed, for example, along the periphery of the light-receiving area APS, but this is merely an example, and the example embodiments are not limited thereto.

Although not specifically illustrated, one or more dummy pixels may be formed in the light-receiving area APS, e.g., the one or more dummy pixels may be formed adjacent to the light-blocking area OB, etc.

The first peripheral area PH1 may include a connection region CR and/or pad regions PR, etc., but are not limited thereto. The connection region CR may be formed about the sensor array region SAR, but is not limited thereto. The connection region CR may be formed on one side of the sensor array region SAR, but this is merely an example, and the example embodiments are not limited thereto. Wires may be formed in the connection region CR to transmit/receive electrical signals of the sensor array region SAR, but the example embodiments are not limited thereto.

One or more of the pad regions PR may be formed about the sensor array region SAR. For example, one or more of the pad regions PR may be formed adjacent to at least one edge of the image sensor 10 according to some example embodiments, but this is merely an example and the example embodiments are not limited thereto. The pad regions PR may each be connected to at least one external apparatus, and/or the like, to transmit and/or receive electrical signals between the image sensor 10 and the external apparatus according to some example embodiments.

In the second region S2, the logic circuit region LC may include one or more electronic devices including a plurality of transistors. Electronic devices included in the logic circuit region LC may be electrically connected to the active pixel sensor array APS to provide a certain and/or desired signal to each unit pixel of the active pixel sensor array APS and/or to control an output signal, etc.

Arranged in the logic circuit region LC may be, for example, the control register circuitry 20, the timing generator 30, the row driver 40, the readout circuit 60, the ramp signal generator 70, the buffer unit 80, and/or others, but the example embodiments are not limited thereto. According to at least one example embodiment, arranged in the logic circuit region LC may be, for example, all of the blocks of FIG. 1 except for the active pixel sensor array APS, but the example embodiments are not limited thereto.

The second region S2 may have a second peripheral area PH2 arranged as well locally corresponding to the first peripheral area PH1 of the first region S1, but the example embodiments of the inventive concepts are not limited thereto.

Figure 4:
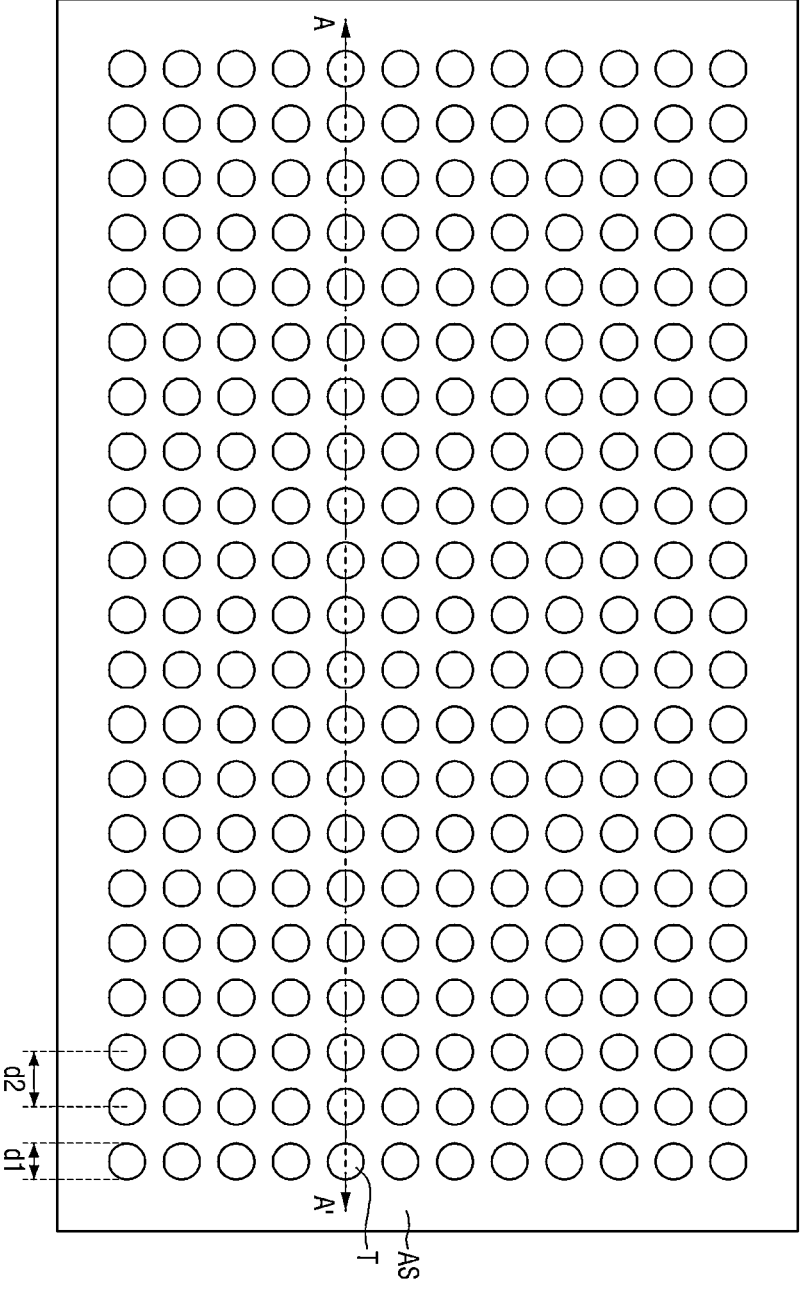
FIG. 4 is a plan view of an image sensor according to some example embodiments.
Figure 5:
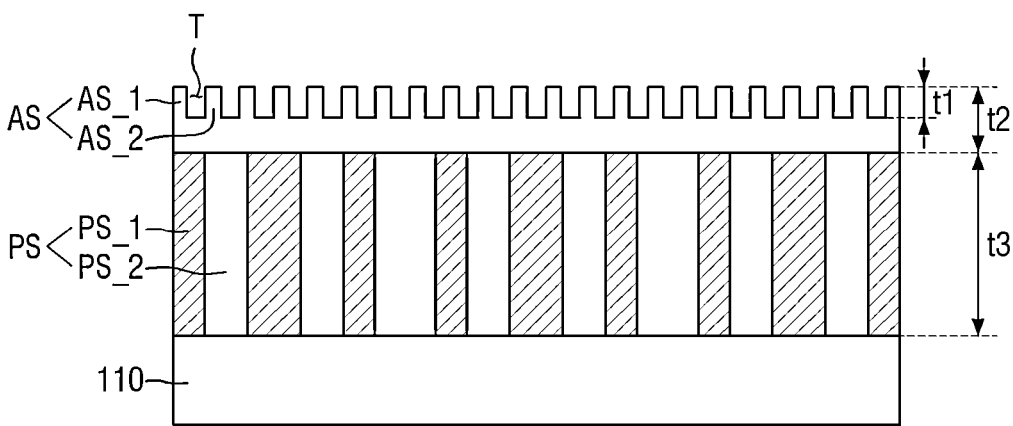
FIG. 5 is a schematic diagram of a cross-section taken along line A-A' of FIG. 4, according to at least one example embodiment.

FIG. 4 is a plan view of an image sensor according to some example embodiments. FIG. 5 is a schematic diagram of a cross-section taken along line A-A' of FIG. 4 according to at least one example embodiment.

The image sensor according to some example embodiments may include a substrate 110, a prism structure PS, and/or an anti-reflection structure AS, etc.

Referring to FIGS. 4 and 5, the substrate 110 may be provided. For example, the substrate 110 may correspond to a first substrate 110 and/or a second substrate 220 of FIG. 9 to be described below. However, the example embodiments of the inventive concepts are not limited thereto.

The prism structure PS may be disposed on the substrate 110. The prism structure PS may include at least one or more nanopatterns PS_1, PS_2, but the example embodiments are not limited thereto. The multiple nanopatterns PS_1, PS_2 are arranged at desired and/or predetermined intervals and by desired and/or predetermined sizes to selectively reflect light in a desired and/or specific wavelength area of incident light and to transmit light in the remaining wavelength area. The prism structure PS may use the nanopatterns PS_1, PS_2 to separate and condense incident light according to wavelengths, etc.

The multiple nanopatterns PS_1, PS_2 may be arranged according to a desired and/or predetermined rule. Here, the rules are applied to parameters such as the shape, size (e.g., width, length, and/or height), spacing, and/or arrangement of the nanopatterns PS_1, PS_2, and these parameters may be determined according to the target phase distribution to be implemented for incident light by the nanopatterns PS_1, PS_2, but is not limited thereto. The target phase distribution may be determined in consideration of a target area at which the incident light wavelengths after separation are condensed, but are not limited thereto.

For example, the target phase distribution may refer to a phase distribution of the incident light at a position immediately after the incident light passes through the prism structure PS. The prism structure PS may separate the incident light for each wavelength and adjust the phase distribution of the light of each wavelength to render the separated light beams of the respective wavelengths to be focused on a desired and/or predetermined target area, respectively.

The prism structure PS may include the nanopatterns PS_1, PS_2 including a material having a higher refractive index than the surrounding refractive index, and a material having a refractive index lower than that of the nanopatterns PS_1, PS_2.

The nanopatterns PS_1, PS_2 including material of high refractive index may include at least one of, for example, c-Si, p-Si, a-Si, III-V compound semiconductors (GaP, GaN, GaAs, etc.), SiC, $TiO_2$, and/or SiN, etc., but are not limited thereto. The material having a lower refractive index than the nanopatterns PS_1, PS_2 may include any one of glass (e.g., fused silica, BK7, etc.), quartz, polymer (e.g., PMMA, SU-8, etc.), and/or plastic, etc., but are not limited thereto.

For example, the nanopatterns PS_1, PS_2 may be provided in a desired shape, e.g., a nanopost shape, a pyramid shape, and/or a cone shape, etc. As another example, when the nanopatterns PS_1, PS_2 include materials having different refractive indices, one nanopattern PS_1 may be surrounded by the other nanopattern PS_2 that is provided in the form of a film, but is not limited thereto. However, the example embodiments of the inventive concepts are not limited thereto and may have different structures and/or arrangements.

The anti-reflection structure AS may be disposed on the prism structure PS, but is not limited thereto. In a plan view, the anti-reflection structure AS may be formed as a hole array having a plurality of interspaced holes, but is not limited thereto, and for example, may have an array of openings (e.g., an opening array) with one or more different shapes, etc. The hole array may include at least the first and second patterns AS_1, AS_2 spaced apart from each other in the second and third directions X and Y, and one or more trenches T between the first and second patterns AS_1 and AS_2, but the example embodiments are not limited thereto, and for example, there may be a different number of patterns and/or trenches, etc.

In a plan view, the first and second patterns AS_1, AS_2, and the trenches T may be provided in a regular or irregularly arranged array form. In some example embodiments, the trenches T may be provided in the form of holes, but are not limited thereto.

The anti-reflection structure AS may be disposed on top of the image sensor, but is not limited thereto. The trench T may have sidewalls and a bottom surface that are exposed to be in direct contact with another medium such as air, etc. More specifically, the anti-reflection structure AS contacts have an increased contact area of the first and second patterns AS_1, AS_2 with another medium such as air, thereby reducing the difference of the refractive index of the anti-reflection structure AS from another medium such as air when compared to a case where no pattern is formed on the anti-reflection structure AS.

Referring to FIGS. 4 and 5, the first and second patterns AS_1, AS_2 may each be provided in a pillar shape, but are not limited thereto. In this case, the trench T may have a certain width d1, e.g., a certain and/or desired diameter d1 of the top of the trench hole.

When measured in the second direction (e.g., X direction, etc.) or the third direction (e.g., Y direction, etc.), the width d1 of the trench T, e.g., the diameter d1 of the top of the trench hole may be 5 nm or more and 50 nm or less, but is not limited thereto. The spacing d2 between the centers of the trenches T, that is, the pitch d2 of the holes may be 5 nm or more and 100 nm or less, but is not limited thereto. However, these figures are examples, and the example embodiments of the inventive concepts are not limited thereto.

When measured in the first direction Z, the prism structure PS may have a thickness t3 of 10 nm or more and 1500 nm or less, but is not limited thereto. When measured in the first direction Z, the trench T may have depth t1 of 1 nm or more and 200 nm or less, but is not limited thereto. In the first direction Z, the first and second patterns AS_1, AS_2 may have a thickness t2 of 10 nm or more and 500 nm or less, but is not limited thereto. However, these figures are examples, and the example embodiments of the inventive concepts are not limited thereto.

Figure 6:
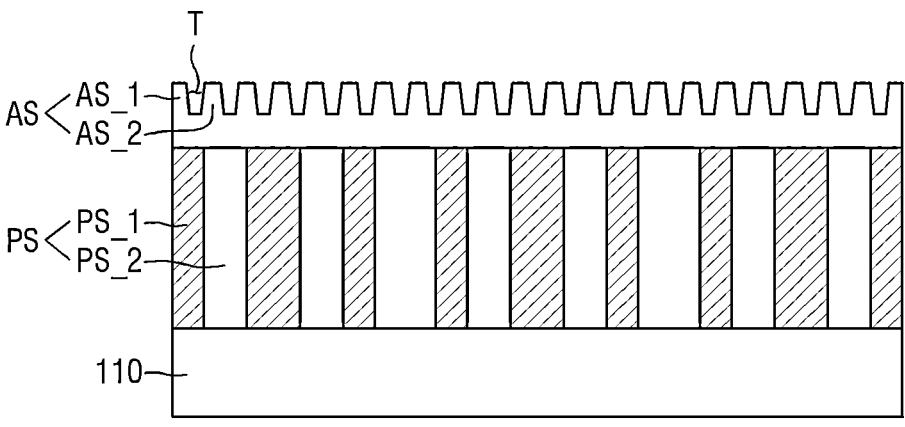
FIG. 6 is a diagram of an image sensor according to some example embodiments, corresponding to FIG. 4.
Figure 7:
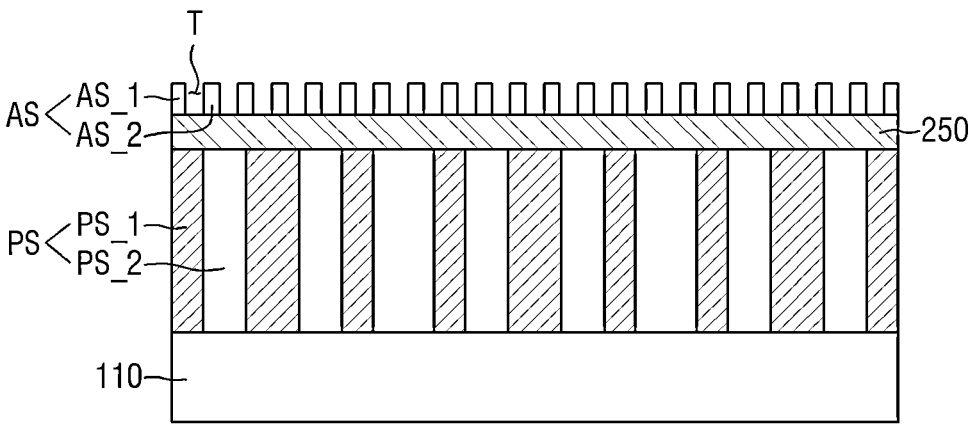
FIG. 7 is a diagram of an image sensor according to some example embodiments, corresponding to FIG. 4.
Figure 8:
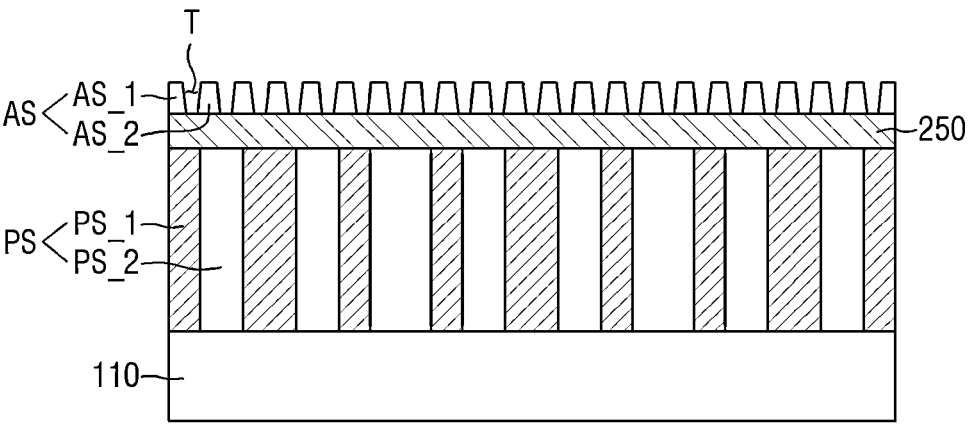
FIG. 8 is a diagram of an image sensor according to some example embodiments, corresponding to FIG. 4.

FIG. 6 is a diagram of an image sensor according to some example embodiments, corresponding to FIG. 4. FIG. 7 is a diagram of an image sensor according to some example embodiments, corresponding to FIG. 4. FIG. 8 is a diagram of an image sensor according to some example embodiments, corresponding to FIG. 4. For purposes of brevity, the following may omit redundant descriptions of like components and their functions as described in connection with FIGS. 1 to 5.

Referring to FIG. 6, each of the first and second patterns AS_1, AS_2 may be provided in a tapered shape, e.g., a width of the top surface of the AS may be smaller than the width of the bottom surface of the AS, but the example embodiments are not limited thereto, and one or more of the patterns may have different shapes, dimensions, etc. In this case, when measured in the second direction (X) or the third direction (Y), the width d1 of the trench T may decrease toward the substrate 110.

Referring to FIG. 7, at least one oxide layer 250 may be disposed between the prism structure PS and the anti-reflection structure AS, but is not limited thereto. When measured in the first direction Z, the thickness of the oxide layer 250 may be smaller than the thickness of the prism structure PS and smaller than the thickness of the anti-reflection structure AS, but is not limited thereto. For example, the thickness of the oxide layer 250 along the first direction Z may be 10 nm or more and 300 nm or less, etc. However, this is an example, and the example embodiments of the inventive concepts are not limited thereto.

According to at least one example embodiment, the oxide layer 250 may include aluminum oxide. However, the example embodiments of the inventive concepts are not limited thereto.

According to at least one example embodiment, each of the first and second patterns AS_1, AS_2 may be provided in a pillar shape, etc.

Referring to FIG. 8, at least one oxide layer 250 may be disposed between the prism structure PS and the anti-reflection structure AS. Each of the first and second patterns AS_1, AS_2 may be provided in a tapered shape, but is not limited thereto.

Figure 9:
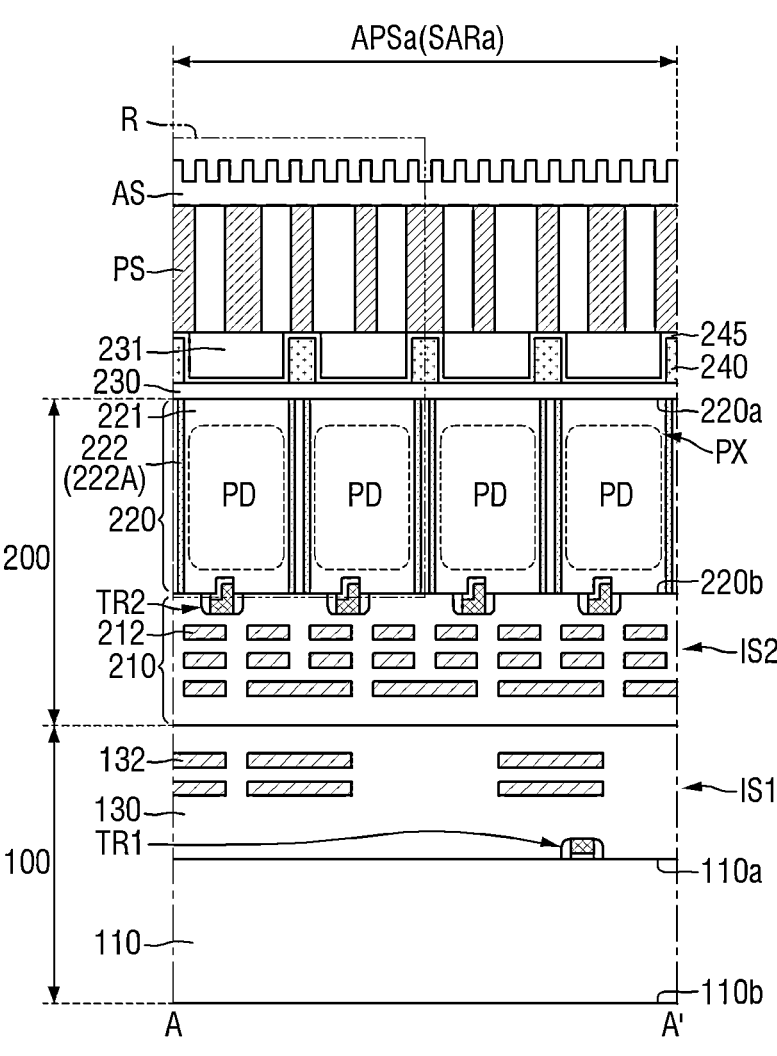
FIG. 9 is a diagram illustrating a sensor array region, corresponding to FIG. 4, according to at least one example embodiment.
Figure 10:
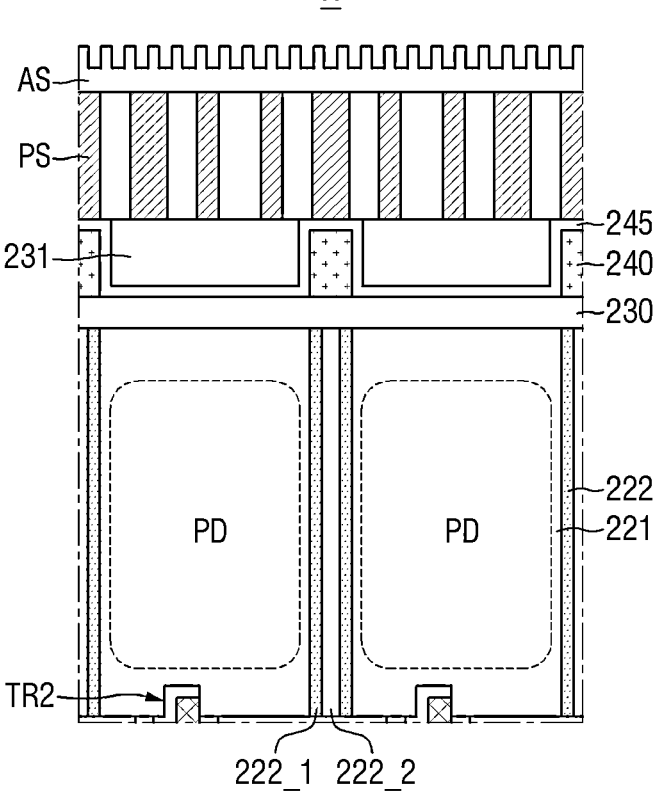
FIG. 10 is an enlarged view of a region 'R' of FIG. 9, according to at least one example embodiment.
Figure 11:
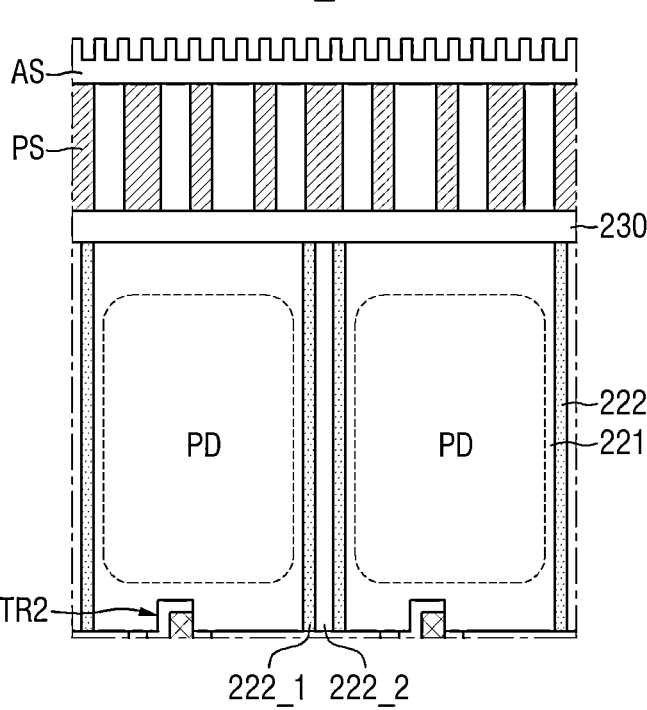
FIG. 11 is a diagram of an image sensor according to some example embodiments, similar to FIG. 10.
Figure 13:
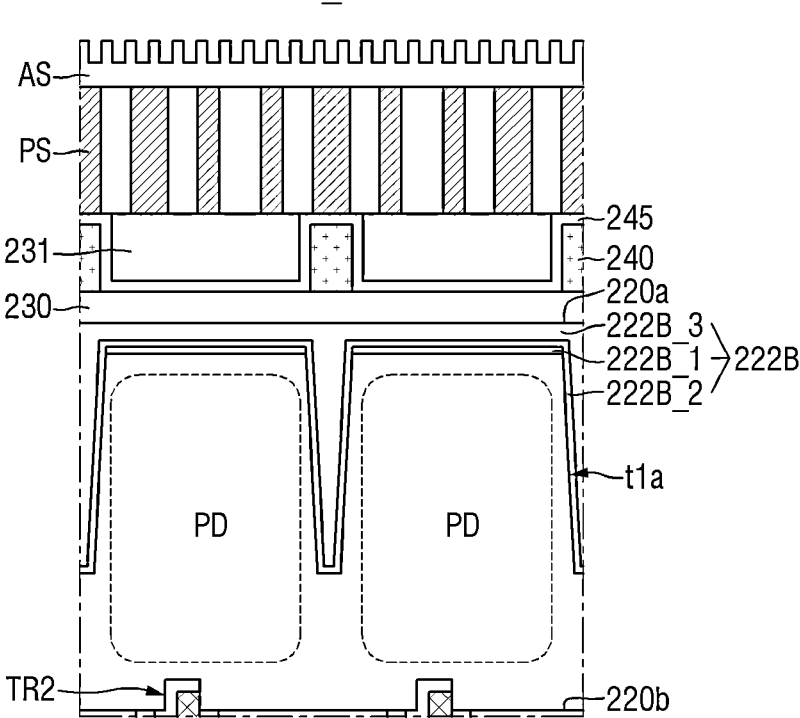
FIG. 13 is a diagram of an image sensor according to some example embodiments, similar to FIG. 10.

FIG. 9 is a diagram illustrating a sensor array region, corresponding to FIG. 4 according to at least one example embodiment. FIG. 10 is an enlarged view of a region 'R' of FIG. 9 according to at least one example embodiment. FIG. 11 is a diagram of an image sensor according to some example embodiments, similar to FIG. 10. FIG. 12 is a diagram of an image sensor according to some example embodiments, similar to FIG. 10. FIG. 13 is a diagram of an image sensor according to some example embodiments, similar to FIG. 10. For purposes of brevity, the following discussion may omit redundant descriptions of like components and their previously described functions in connection with FIGS. 1 to 8, but the example embodiments are not limited thereto.

Additionally, FIGS. 9 to 13 illustrate the prism structure PS and the anti-reflection structure AS of FIG. 5 as being employed, although the example embodiments are not limited thereto. More specifically, it should be understood that the configurations of FIGS. 9 to 13 may employ the prism structure PS and the anti-reflection structure AS of any one of FIGS. 6 to 8, etc.

Moreover, the number and size of each of the nanopatterns PS_1, PS_2 of the prism structure PS and the respective patterns AS_1, AS_2 of the anti-reflection structure AS shown in any one of FIGS. 9 to 13 are examples, and the example embodiments are not limited to what is shown in FIGS. 9 to 13.

Referring to FIG. 9, an image sensor according to some example embodiments includes a first substrate 110, a first interconnection structure IS1, a second interconnection structure IS2, a second substrate 220, a surface insulating layer 230, a color filter 231, a grid pattern 240, a prism structure PS, and/or an anti-reflection structure AS, etc., but is not limited thereto.

The first substrate 110 may be bulk silicon or silicon-on-insulator (SOI), etc., but is not limited thereto. The first substrate 110 may be a silicon substrate or may include other materials, for example, silicon germanium, indium anti-monide, lead tellurium compound, indium arsenide, indium phosphide, gallium arsenide, and/or gallium antimonide, etc. Additionally, the first substrate 110 may have an epitaxial layer formed on the base substrate, etc.

The first substrate 110 may include a first surface 110a and a second surface 110b that are opposite to each other. In some example embodiments, the first surface 110a of the first substrate 110 may be configured to face a fourth surface 220b of the second substrate 220.

On the first substrate 110, a plurality of electronic devices may be formed. For example, the first surface 110a of the first substrate 110 may be formed with at least one first electronic device TR1, etc. The first electronic device TR1 may be electrically connected with a sensor array region SARa to transmit and/or receive electrical signals to and from the respective unit pixels of the sensor array region SARa, etc. For example, the first electronic device TR1 may include electronic devices such as those of FIG. 1, e.g., including the control register circuitry 20, the timing generator 30, the row driver 40, the active pixel sensor array APS, the readout circuit 60, the ramp signal generator 70, and/or the buffer unit 80, etc., but the example embodiments are not limited thereto.

The first interconnection structure IS1 may be formed on the first substrate 110. For example, the first interconnection structure IS1 may cover the first surface 110a of the first substrate 110, but is not limited thereto. The first substrate 110 and the first interconnection structure IS1 may be included in the first substrate structure 100.

The first interconnection structure IS1 may be attached to the second interconnection structure IS2. For example, as illustrated in FIG. 9, the top surface of the first interconnection structure IS1 may be attached to the bottom surface of the second interconnection structure IS2.

The first interconnection structure IS1 may include one or more wiring lines. For example, the first interconnection structure IS1 may include a first inter-wiring insulating layer 130 and/or a plurality of wiring lines 132 in the first inter-wiring insulating layer 130, etc. In FIG. 9, the number of wire layers of the wiring lines and their arrangement constituting the first interconnection structure IS1 are merely examples and are not limited thereto.

The first inter-wiring insulating layer 130 may include, but is not limited to, at least one of silicon oxide, silicon nitride, silicon oxynitride, and/or a low-permittivity or low-k material having a dielectric constant lower than that of silicon oxide, for example, but the example embodiments are not limited thereto. In some example embodiments, the first interconnection structure IS1 may include the same material as the second interconnection structure IS2, but is not limited thereto.

At least some of the wiring lines 132 of the first interconnection structure IS1 may be connected with the first electronic device TR1. Although not specifically illustrated, the first interconnection structure IS1 may include the first wiring lines 132 in the sensor array region SARa, a second wiring line in the connection region CR, and/or third wiring lines in the pad regions PR, etc. In some example embodiments, the second wiring line may be an uppermost wiring line among the plurality of wiring lines in the connection region CR, and the third wiring lines may be the uppermost wiring lines among the plurality of wiring lines in the pad regions PR, etc., but are not limited thereto.

The first wiring line 132, the second wiring line, and/or the third wiring lines may include, but are not limited to, at least one of tungsten (W), copper (Cu), aluminum (Al), gold (Au), silver (Ag), and alloys thereof, for example, but the example embodiments are not limited thereto.

The second substrate 220 may be a semiconductor substrate. For example, the second substrate 220 may be bulk silicon or silicon-on-insulator (SOI), etc. The second substrate 220 may be a silicon substrate or may include another material, for example, silicon germanium, indium antimonide, lead telluride, indium arsenide, indium phosphide, gallium arsenide, and/or gallium antimonide, etc. Additionally, the second substrate 220 may have an epitaxial layer formed on the base substrate, etc.

The second substrate 220 may include a third surface 220a and a fourth surface 220b that are opposite to each other. In some example embodiments to be described below, the third surface 220a may be referred to as the back side of the second substrate 220, and the fourth surface 220b may be referred to as the front side of the second substrate 220. In some example embodiments, the third surface 220a of the second substrate 220 may be a light-receiving surface on which light is incident. This means that the image sensor according to some example embodiments may be a backside illumination type (BSI) image sensor.

On the second substrate 220 of the sensor array region SARa, a plurality of unit pixel regions 221 may be formed. A plurality of pixels may be formed by arranging the prism structure PS and the anti-reflection structure AS on each of the plurality of unit pixel regions 221 and arranging color filters 231, etc.

For example, a plurality of pixels may be formed within the light-receiving area APSa where the pixels are arranged two-dimensionally (e.g., in a matrix form) in a plane including the second direction X and the third direction Y, but the example embodiments are not limited thereto.

The pixel isolation pattern 222A may be formed in a mesh-like lattice shape in the second substrate 220 of the sensor array region SARa, but is not limited thereto. The pixel isolation pattern 222A may be formed by, for example, filling an insulating material in a deep trench formed by patterning the second substrate 220, etc. In some example embodiments, the pixel isolation pattern 222A may extend in the first direction Z and penetrate the second substrate 220, but is not limited thereto. For example, as illustrated in FIG. 9, the pixel isolation pattern 222A may extend from the third surface 220a to the fourth surface 220b. The pixel isolation pattern 222A may be, e.g., a frontside deep trench isolation (FDTI), etc.

The pixel isolation pattern 222A may define the unit pixel regions 221. The pixel isolation pattern 222A may be formed in a mesh-like lattice shape in a plan view to separate the plurality of pixels at pixel regions PX from each other, but the example embodiments are not limited thereto.

For example, as shown in FIG. 9, the unit pixel regions 221 arranged within the light-receiving area APSa may be separated from each other. Accordingly, the pixel isolation pattern 222A may be formed to surround the respective unit pixel regions 221 in a plan view. The pixel isolation pattern 222A may be interposed between the multiple photoelectric conversion devices PD to separate the photoelectric conversion devices PD.

Referring to FIG. 10, the pixel isolation pattern 222A may include at least one insulating spacer layer 222_1 and/or at least one filling conductive layer 222_2, but the example embodiments are not limited thereto. The insulating spacer layer 222_1 may extend along the side surface of the trench formed in the second substrate 220. The filling conductive layer 222_2 may be formed on the insulating spacer layer 222_1 to fill the remaining region of the trench.

In some example embodiments, the insulating spacer layer 222_1 may include at least one oxide layer having a lower refractive index than that of the second substrate 220. For example, the insulating spacer layer 222_1 may include, but is not limited to, at least one of silicon oxide, aluminum oxide, tantalum oxide, etc., and/or a combination thereof. The insulating spacer layer 222_1 having a lower refractive index than that of the second substrate 220 may refract and/or reflect light obliquely incident to the photoelectric conversion device PD. Further, the insulating spacer layer 222_1 may decrease and/or prevent photocharges generated in a specific unit pixel by incident light from moving to an adjacent unit pixel due to random drift. This means that the insulating spacer layer 222_1 may improve the light-receiving rate, efficiency, and/or accuracy of the photoelectric conversion device PD.

In some example embodiments, the filling conductive layer 222_2 may include a conductive material. For example, the filling conductive layer 222_2 may include, but is not limited to, poly Si, etc. In some example embodiments, a ground voltage or a negative voltage may be applied to the filling conductive layer 222_2 including a conductive material. This can effectively decrease and/or prevent the defect of an electrostatic discharge (ESD) bruise of the image sensor according to some example embodiments. Here, the ESD bruise defect refers to a phenomenon where electric charges generated by the ESD or the like are accumulated on the surface of the substrate (e.g., the first surface 110a), thereby causing a bruise-like stain in a generated image.

The unit pixels may include photoelectric conversion devices PD, respectively. The photoelectric conversion devices PD may be formed in the second substrate 220 of the light-receiving area APSa. The photoelectric conversion devices PD, PD1, and PD2 may generate electric charges in proportion to the amount of light incident from the outside (e.g., from an external source, etc.). In some example embodiments, the photoelectric conversion device PD may not be formed in some of the light-blocking area OB, but is not limited thereto. For example, the photoelectric conversion device PD may be formed in the second substrate 220 of the light-blocking area OB adjacent to the light-receiving area APSa, but may not be formed in the second substrate 220 of the light-blocking area OB spaced apart from the light-receiving area APSa, etc.

The photoelectric conversion device PD may include, but is not limited to, at least one of a photodiode, a photo transistor, a photo gate, a pinned photodiode, an organic photodiode, quantum dots, etc., and/or combinations thereof, for example.

Each unit pixel may include at least one second electronic device TR2, but are not limited thereto. In some example embodiments, the second electronic device TR2 may be formed on the fourth surface 220b of the second substrate 220. The second electronic device TR2 may be connected with the photoelectric conversion device PD and may include various transistors for processing electrical signals. For example, the second electronic device TR2 may include transistors such as a transfer transistor TX, a reset transistor RX, a source follower transistor SF, and/or a selection transistor SEL, etc.

In some example embodiments, the second electronic device TR2 may include a vertical transfer transistor. For example, some of the aforementioned second electronic device TR2 including the transfer transistor TX may extend into the second substrate 220. Such a transfer transistor TX may reduce the area of a unit pixel, thereby enabling high integration of the image sensor and/or decreasing the physical size of the image sensor, etc.

The second interconnection structure IS2 may be formed on the second substrate 220. For example, the second interconnection structure IS2 may cover the fourth surface 220b of the second substrate 220, but is not limited thereto. The second substrate 220 and the second interconnection structure IS2 may be included in a second substrate structure 200.

The second interconnection structure IS2 may be composed of one or more wiring lines. For example, the second interconnection structure IS2 may include at least one second inter-wiring insulating layer 210 and/or a plurality of fourth wiring lines 212 in the second inter-wiring insulating layer 210, etc.

In FIG. 9, the number of wire layers of the wiring lines and their arrangement included in the second interconnection structure IS2 are merely examples. The second inter-wiring insulating layer 210 may include, but is not limited to, at least one of silicon oxide, silicon nitride, silicon oxynitride, and/or a low-k material having a dielectric constant lower than that of silicon oxide, etc., for example.

Although not particularly illustrated, the second interconnection structure IS2 may include the fourth wiring lines 212 in the sensor array region SARa and/or a fifth wiring line in the connection region CR, etc. The fourth wiring lines 212 may be electrically connected to unit pixels of the sensor array region SARa. For example, the fourth wiring line 212 may be connected with the second electronic device TR2. The fifth wiring line may extend from the sensor array region SARa. For example, the fifth wiring line may be electrically connected with at least some of the fourth wiring line 212. Accordingly, the fifth wiring line may be electrically connected to the unit pixel of the sensor array region SARa.

The fourth wiring lines 212 and the fifth wiring line may include, but are not limited to, at least one of tungsten (W), copper (Cu), aluminum (Al), gold (Au), silver (Ag), and alloys thereof, etc., for example.

The surface insulating layer 230 may be formed on the third surface 220a of the second substrate 220. The surface insulating layer 230 may extend along the third surface 220a of the second substrate 220. In some example embodiments, at least some of the surface insulating layer 230 may contact the pixel isolation pattern 222A.

The surface insulating layer 230 may include an insulating material. For example, the surface insulating layer 230 may include, but is not limited to, at least one of silicon oxide, silicon nitride, silicon oxynitride, aluminum oxide, hafnium oxide, etc., and/or combinations thereof. Although the surface insulating layer 230 is illustrated as a single layer in the drawings, the example embodiments are not limited thereto, and the surface insulating layer 230 may be formed of a multilayer according to some example embodiments.

The surface insulating layer 230 may decrease and/or prevent reflection of light incident on the second substrate 220, thereby improving the light-receiving rate, the efficiency, and/or accuracy of the photoelectric conversion device PD. Additionally, the surface insulating layer 230 functions as a planarization layer for allowing the color filters 231, the prism structure PS, and the anti-reflection structure AS to be formed at uniform heights, which will be described below.

The color filters 231 are disposed under the prism structure PS and may pass light focused by the prism structure PS to the plurality of pixel regions 221.

The color filters 231 may be formed on the surface insulating layer 230 of the light-receiving area APSa, but are not limited thereto. In some example embodiments, the color filters 231 may be arranged to correspond to the respective pixel regions PX. For example, the color filters 231 may be arranged two-dimensionally (e.g., in a matrix form).

The color filters 231 may have various color filters according to the pixel regions PX. For example, the color filters 231 may be arranged in a Bayer pattern including a red color filter, a green color filter, and/or a blue color filter, etc. However, this is merely an example, and the color filter 231 may include a yellow filter, a magenta filter, a cyan filter, and/or a white filter, etc., and/or may be arranged in different patterns, etc.

The grid pattern 240 may be formed on the surface insulating layer 230. The grid pattern 240 may be formed in a grid shape in a plan view and interposed between the color filters 231, but is not limited thereto.

The grid pattern 240 may include a low refractive index material having a refractive index lower than that of silicon (Si), but is not limited thereto. For example, the grid pattern 240 may include, but is not limited to, at least one of silicon oxide, aluminum oxide, tantalum oxide, etc., and/or a combination thereof. The grid pattern 160 including the low refractive index material may improve the image quality of the image sensor by refracting and/or reflecting light that is obliquely incident on the image sensor.

In some example embodiments, a first passivation layer 245 may be formed on the surface insulating layer 230 and the grid pattern 240. The first passivation layer 245 may be interposed between the surface insulating layer 230 and the color filters 231 and between the grid pattern 240 and the color filters 231, but the example embodiments are not limited thereto. For example, the first passivation layer 245 may extend along the profile of the top surface of the surface insulating layer 230, and/or the side and top surfaces of the grid pattern 240, etc.

The first passivation layer 245 may include, but is not limited to, aluminum oxide, etc., for example. The first passivation layer 245 may decrease and/or prevent damage to the surface insulating layer 230 and the grid pattern 240.

Referring to FIG. 10, no microlens may be disposed on the color filter 231, but the example embodiments are not limited thereto.

Although not specifically shown, the prism structure PS and the anti-reflection structure AS shown in FIGS. 5 to 8 may be formed on at least one of the light-blocking area OB, the connection region CR, and/or the pad regions PR, etc., of FIG. 3.

Referring to FIG. 11, the plurality of pixel regions 221 may have none of a grid pattern 240 and a color filter 231, but the example embodiments are not limited thereto. A surface insulating layer 230 may be disposed between the pixel regions 221 and the prism structure PS.

Referring to FIG. 12, the pixel regions 221 may have none of a grid pattern 240, a color filter 231, and a surface insulating layer 230, but the example embodiments are not limited thereto. The prism structure PS may directly contact the pixel regions 221.

Referring to FIG. 13, a pixel isolation pattern 222B may be provided to penetrate the third surface 220a of the second substrate 220, and may be spaced apart from the fourth surface 220b. The pixel isolation pattern 222B may be a backside deep trench isolation (BDTI), but is not limited thereto.

The pixel isolation pattern 222B may include a first insulating layer 222B_1, a second insulating layer 222B_2, and/or a third insulating layer 222B_3, etc.

The first insulating layer 222B_1 may conform to the third surface 220a of the second substrate 220, for example, a surface on which light is incident to the photoelectric conversion device PD. The first insulating layer 222B_1 may include a metal oxide having a high dielectric constant (high-k), such as a hafnium oxide ($HfO_2$), a hafnium silicon oxide ($Hf_xSi_yO_z$) layer, a titanium oxide ($TiO_2$), a zirconium oxide ($ZrO_2$), a magnesium oxide (MgO), a tantalum oxide ($Ta_2O_5$), a scandium oxide ($Sc_2O_3$), ruthenium oxide ($Lu_2O_3$), yttrium oxide ($Y_2O_3$), and/or lanthanum oxide ($La_2O_3$), etc.

The second insulating layer 222B_2 may conform to the top and side surfaces of the first insulating layer 222B_1 and the sidewalls and bottom surfaces of a pixel isolation trench t1a of the pixel isolation pattern 222B, but is not limited thereto. The pixel isolation trench t1a may extend from the third surface 220a of the second substrate 220 to between the photoelectric conversion devices PD to define the photoelectric conversion devices PD, but is not limited thereto. For example, the second insulating layer 222B_2 may include an electron-rich metal oxide such as aluminum oxide ($Al_2O_3$), etc.

The first and second insulating layers 222B_1 and 222B_2 may be fixed charge layers. This can decrease and/or prevent a dark current, a dark level defect, a white spot defect, etc., thereby improving the photoelectric conversion characteristic, efficiency, and/or accuracy of the photoelectric conversion device PD.

Additionally, the first insulating layer 222B_1 may function as an anti-reflection layer. This allows the first insulating layer 222B_1 to decrease and/or prevent reflection of light incident to the photoelectric conversion device PD from the surface of the second substrate 220.

The third insulating layer 222B_3 may be formed on the second insulating layer 222B_2 and may fill the pixel isolation trench t1a. The third insulating layer 222B_3 may be thicker than the first and/or second insulating layers 222B_1 and/or 222B_2, but is not limited thereto. The third insulating layer 222B_3 may include an insulating material such as silicon oxide ($SiO_2$), etc. The third insulating layer 222B_3 may have a lower dielectric constant and superior peeling characteristics than the first and/or second insulating layers 222B_1 and/or 222B_2, but is not limited thereto.

Formed on the third insulating layer 222B_3 may be color filters 231, a prism structure PS, and/or an anti-reflection structure AS, etc.

FIGS. 14 to 19 illustrate intermediate steps of a method of manufacturing an image sensor according to some example embodiments. For purposes of brevity, the following may omit redundant descriptions of like components and their functions previously described in connection with FIGS. 1 to 13.

Figure 14:
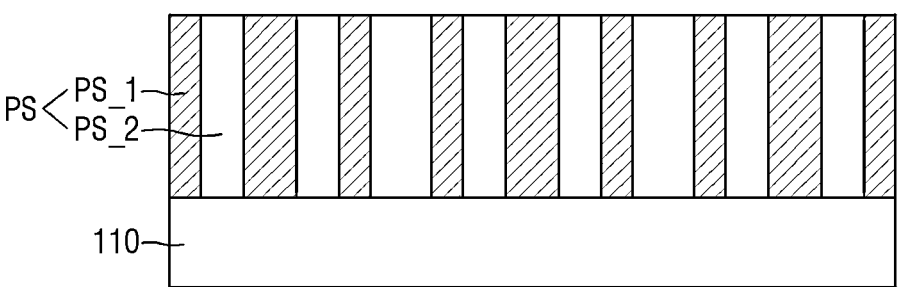

Referring to FIG. 14, a prism structure PS is formed on a substrate 110 and includes a plurality of nanopatterns PS_1, PS_2 according to at least one example embodiment, but the example embodiments are not limited thereto.

Figure 15:
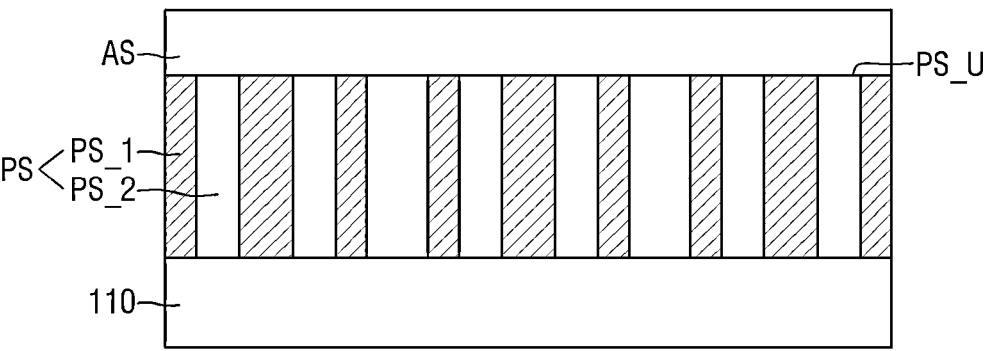

Referring to FIG. 15, the anti-reflection structure AS is formed on an upper surface PS_U of the prism structure PS, but is not limited thereto. In this case, the upper surface PS_U of the prism structure PS may be flat, but is not limited thereto. This may further reduce a difference in refractive index with an external medium when compared to an image sensor formed with microlens having a curved surface, etc.

Figure 16:
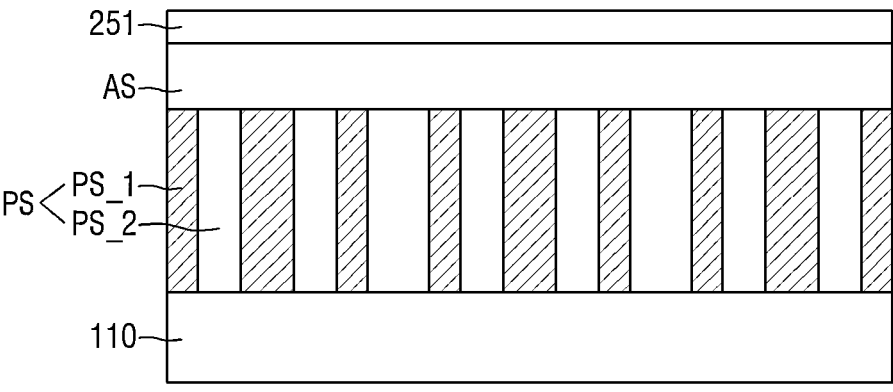

Referring to FIG. 16, at least one neutral layer 251 is formed on the anti-reflection structure AS. The neutral layer 251 may include a material having interfacial affinity between the first and second polymer blocks of a block copolymer layer 252 to be described below.

For example, the neutral layer 251 may include one of a self-assembled monolayer (SAM), a polymer brush, or a cross-linked random copolymer mat, etc. However, the example embodiments of the inventive concepts are not limited thereto.

Figure 17:
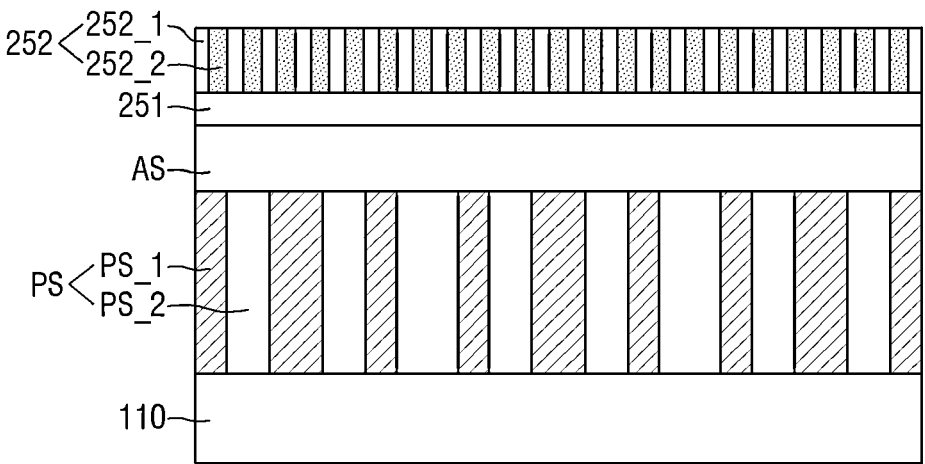

Referring to FIG. 17, at least one block copolymer layer 252 may be formed on the neutral layer 251.

The block copolymer layer 252 may include a first polymer block and/or a second polymer block, etc., but is not limited thereto. The second polymer block may have different properties from the first polymer block, but is not limited thereto.

For example, the first polymer block may include a hydrophilic polymer, polymethylmethacrylate (PMMA), polydimethylsiloxane (PDMS), polyvinylpyrrolidone (PVP), and/or polyethyleneoxide (PEO), but is not limited thereto.

For example, the second polymer block may include a hydrophobic polymer, e.g., polystyrene (PS), etc.

One or more of the example embodiments may utilize thermal annealing, solvent annealing, ultraviolet annealing, and/or the like, to form first and/or second patterns 252_1, 252_2 in the block copolymer layer 252, but the example embodiments are not limited thereto.

The block copolymer layer 252 has a characteristic (e.g., self-assembly, etc.) of making a nanostructure autonomously thanks to the repulsive force and/or attractive force between the polymer chains. Microphase separation occurs when heat is applied to the block copolymer layer 252 to provide polymer chains with sufficient mobility. At this time, the microphases may exhibit a specific orientation to the substrate 110 due to the influence of mutual attraction between the chains of the block copolymer layer 252 and the surface of the substrate 110.

For example, to induce microphase separation, one or more of the example embodiments may utilize a thermal annealing method that heats the block copolymer layer 252 to 40° C. or higher and 600° C. or lower, but the example embodiments are not limited thereto.

Figure 18:
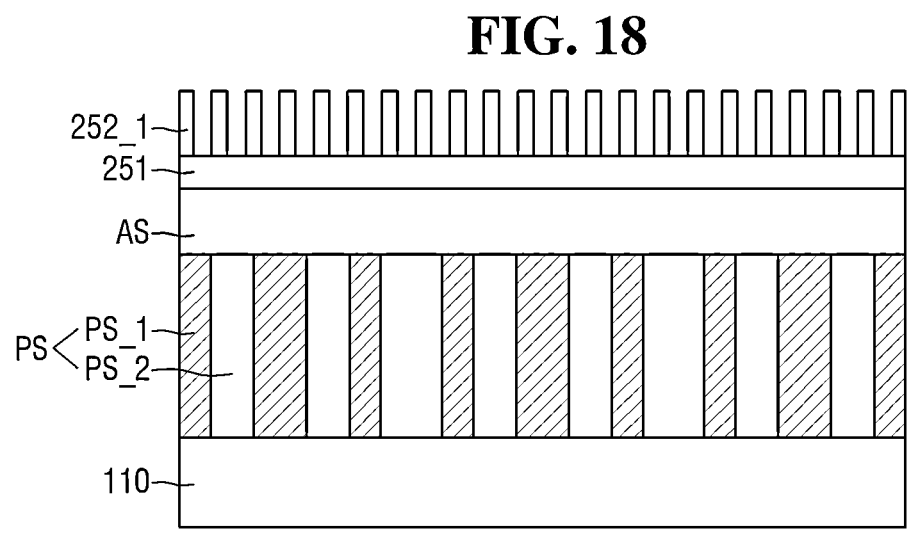

Referring to FIG. 18, some patterns of the block copolymer layer 252 may be selectively dissolved according to some example embodiments. More specifically, the second pattern 252_2 may be selectively removed, leaving only the first pattern 252_1 intact, but the example embodiments are not limited thereto.

Figure 19:
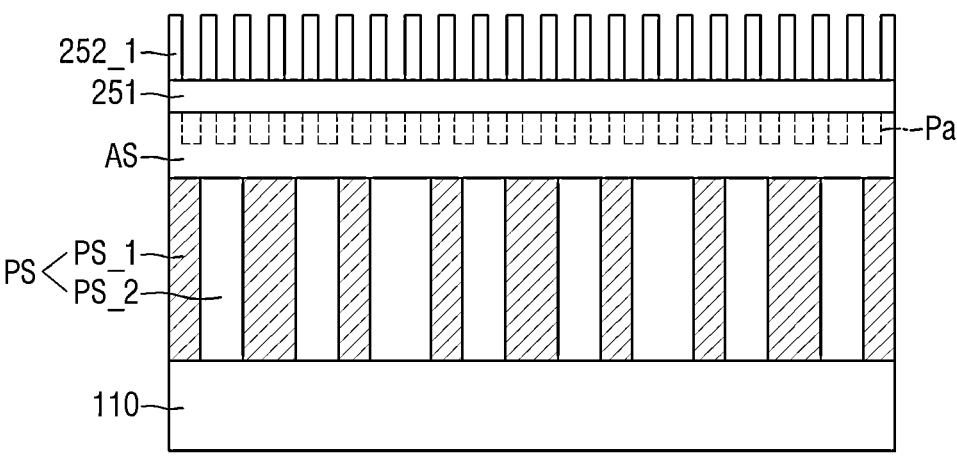

Referring to FIG. 19, some of the anti-reflection structure AS may be removed by copying the first pattern 252_1 into the anti-reflection structure AS, but the example embodiments are not limited thereto. Partial removal of the anti-reflection structure AS may be performed by using an etching process, etc. In this case, a pattern Pa may be formed with a desired and/or predetermined depth from the upper surface of the anti-reflection structure AS by using the first pattern 252_1 as a mask.

Thereafter, the neutral layer 251 and the remaining block copolymer layer 252 may be removed to form the image sensor of FIG. 5, including the prism structure PS and the anti-reflection structure AS.

Figure 20:
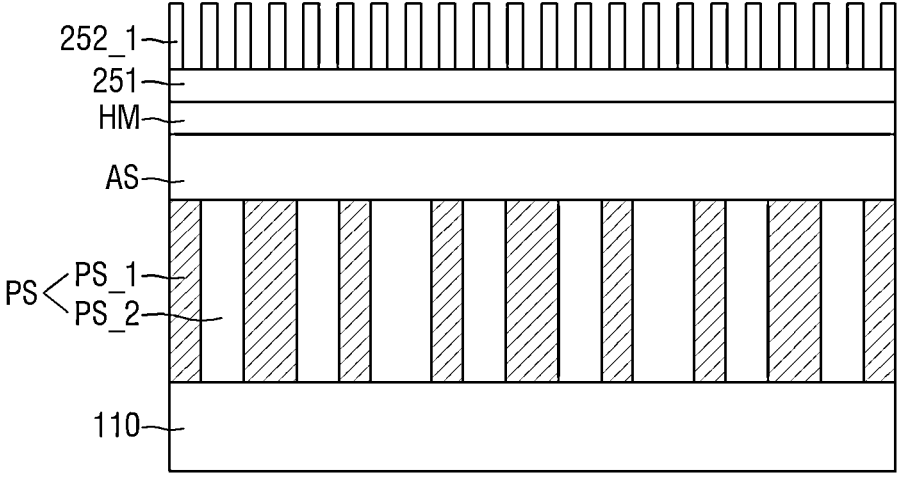
Figure 21:
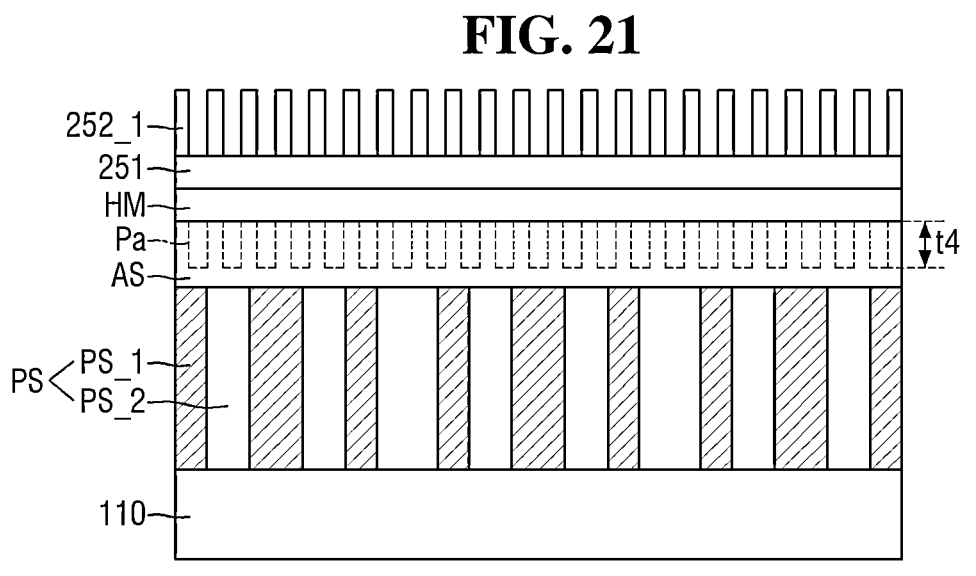

FIGS. 20 and 21 illustrate intermediate steps of a method of manufacturing an image sensor according to some example embodiments.

Referring to FIG. 20, a hard mask layer HM may be formed between the anti-reflection structure AS and the neutral layer 251, but is not limited thereto. The hard mask layer HM may serve to assist and/or reinforce the first pattern 252_1 with its mask function, etc.

Referring to FIG. 21, a pattern Pa may be formed to have a desired and/or predetermined depth from the upper surface of the anti-reflection structure AS by using the hard mask layer HM as a mask. In this case, the pattern Pa may be formed to have an etching depth t4 that is greater than that of the pattern Pa of FIG. 19.

Figure 22:
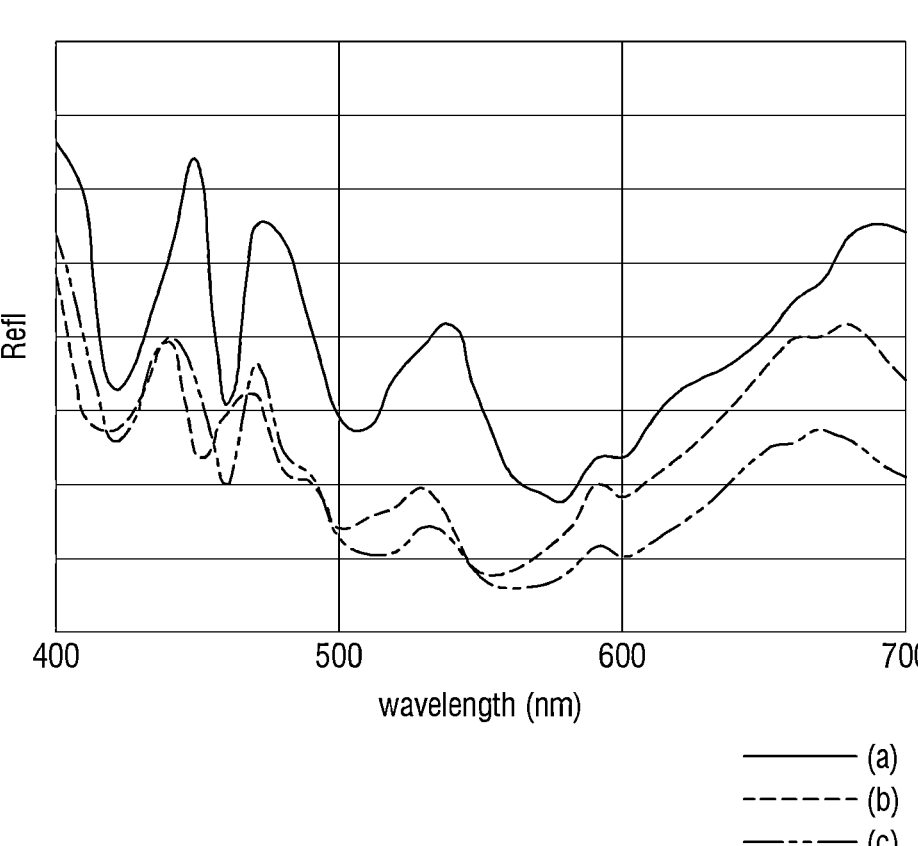
FIGS. 22 and 23 are diagrams for explaining an effect of an image sensor according to some example embodiments.
Figure 23:
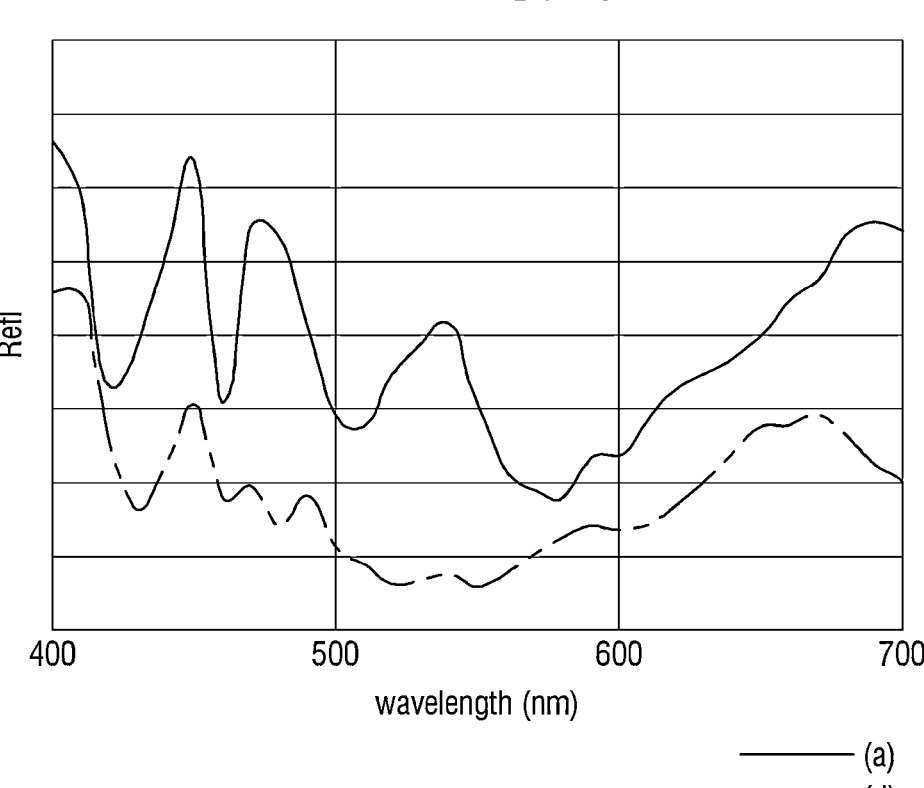

FIGS. 22 and 23 are diagrams for explaining an effect of an image sensor according to some example embodiments.

FIG. 22 is a graph illustrating a case where multiple patterns are formed in the anti-reflection structure AS according to some example embodiments and the graph illustrates a comparison of the trenches T of FIG. 2 by their widths, that is, a large diameter of the upper hole surface against a small diameter of the upper hole surface.

Referring to FIG. 22, compared to an (a)-case where no pattern is formed in the anti-reflection structure AS, reflectance can be seen as reduced in the (b)- and (c)-cases where the pattern and the trench are formed in the anti-reflection structure AS. Additionally, the reflectance can be seen as further reduced in the (c)-case with a relatively large width of the trench T as compared to the (b)-case with a relatively small width of the trench T.

FIG. 23 is a graph comparing a case where the oxide layer 250 is formed between the anti-reflection structure AS and the prism structure PS according to some example embodiments to a case where no oxide layer is formed therebetween.

Referring to FIG. 23, with (d)-case where the oxide layer 250 is formed between the anti-reflection structure AS and the prism structure PS, the reflectance can be seen as desirably reduced compared to (a)-case where no such oxide layer 250 is formed.

Although a few example embodiments of the inventive concepts have been described with reference to the accompanying drawings, the inventive concepts are not limited to the above example embodiments and may be manufactured in a variety of different forms, and those of ordinary skill in the art will readily appreciate that many more modifications are possible to the example embodiments without departing from the novel teachings and advantages of the inventive concepts. Accordingly, all such modifications are intended to be included within the scope of the inventive concepts as defined in the claims. Therefore, it is to be understood that the example embodiments described above are illustrative in all respects and not restrictive.

The invention claimed is:

1. An image sensor, comprising:
a substrate;
a prism structure on the substrate, the prism structure including at least one nanopattern, the at least one nanopattern having a top surface and a bottom surface, the top surface vertically aligned with the bottom surface; and
an anti-reflection structure on the prism structure, the anti-reflection structure including at least one opening array, the opening array including a plurality of spaced-apart openings, wherein
the top surface of the at least one nanopattern contacts a bottom surface of the anti-reflection structure.

2. The image sensor of claim 1, wherein the at least one opening array comprises:
a plurality of first patterns; and
a trench between the plurality of first patterns.

3. The image sensor of claim 2, wherein the trench has a width which decreases in a direction towards the substrate.

4. The image sensor of claim 2, wherein each of the plurality of first patterns have a columnar shape.

5. The image sensor of claim 2, wherein each of the plurality of first patterns have a tapered shape.

6. The image sensor of claim 1, wherein the anti-reflection structure is on a flat upper surface of the prism structure.

7. The image sensor of claim 1, further comprising:
at least one oxide layer between the prism structure and the anti-reflection structure.

8. The image sensor of claim 1, further comprising:
a plurality of pixel regions defined by pixel isolation patterns on the substrate; and
one or more color filters under the prism structure, the one or more color filters configured to pass light focused by the prism structure to the plurality of pixel regions.

9. The image sensor of claim 8, wherein no microlens is on the one or more color filters.

10. The image sensor of claim 1, wherein the at least one nanopattern of the prism structure is configured to separate and condense incident light by wavelength.

11. An image sensor, comprising:
a substrate having an upper surface extending in a first direction and a second direction, the first direction and the second direction perpendicular to each other, the substrate including a plurality of pixel isolation patterns extending in a third direction;
a plurality of pixel regions defined by the plurality of pixel isolation patterns;
a prism structure on the plurality of pixel regions, the prism structure including at least one nanopattern; and
an anti-reflection structure on the prism structure, the anti-reflection structure including an opening array, the opening array including a plurality of spaced-apart openings, wherein
the at least one nanopattern includes a top surface and a bottom surface, the top surface vertically aligned with the bottom surface, and
the top surface of the at least one nanopattern contacts a bottom surface of the anti-reflection structure.

12. The image sensor of claim 11, wherein the opening array comprises:
a plurality of first patterns; and
a trench between the plurality of first patterns, and
the trench includes a plurality of sidewalls and a bottom surface that are in direct contact with air.

13. The image sensor of claim 12, wherein the trench has a width which decreases in a direction toward the substrate.

14. The image sensor of claim 12, wherein the trench has a width which is constant in a direction towards the substrate.

15. The image sensor of claim 11, further comprising:

at least one oxide layer between the prism structure and the anti-reflection structure.

16. The image sensor of claim 15, wherein the prism structure is greater in thickness than the at least one oxide layer in the third direction.

17. The image sensor of claim 11, wherein the at least one nanopattern of the prism structure is configured to separate and condense incident light by wavelength.

18. A method of manufacturing an image sensor, comprising:

forming a prism structure on a substrate;

forming an anti-reflection structure on the prism structure;

forming a neutral layer on the anti-reflection structure;

forming a block copolymer layer on the neutral layer;

annealing the block copolymer layer to form a first pattern and a second pattern;

selectively removing the first pattern out of the first pattern and the second pattern; and forming a plurality of spaced-apart anti-reflection structure patterns by using the second pattern as a mask.

19. The method of claim 18, further comprising:

forming at least one oxide layer between the prism structure and the anti-reflection structure.

20. The method of claim 18, further comprising:

forming a hard mask layer between the anti-reflection structure and the neutral layer.

\* \* \* \* \*